(12) United States Patent
Steck et al.

(10) Patent No.: US 9,594,118 B2
(45) Date of Patent: Mar. 14, 2017

(54) METHOD FOR PREDICTING THE USABILITY OF A RELAY OR A CONTACTOR

(75) Inventors: Armin Steck, Kusterdingen (DE); Ralf Piscol, Herrenberg (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 293 days.

(21) Appl. No.: 13/877,800

(22) PCT Filed: Sep. 1, 2011

(86) PCT No.: PCT/EP2011/065097
§ 371 (c)(1),
(2), (4) Date: Jul. 12, 2013

(87) PCT Pub. No.: WO2012/045532
PCT Pub. Date: Apr. 12, 2012

(65) Prior Publication Data
US 2013/0278269 A1   Oct. 24, 2013

(30) Foreign Application Priority Data

Oct. 5, 2010   (DE) .................. 10 2010 041 998

(51) Int. Cl.
*G01R 31/02*   (2006.01)
*G01R 31/327*   (2006.01)
(Continued)

(52) U.S. Cl.
CPC ........ *G01R 31/3278* (2013.01); *B60L 3/0046* (2013.01); *B60L 3/04* (2013.01);
(Continued)

(58) Field of Classification Search
CPC .... B60L 2240/545–2240/549; G01R 31/3278; H01H 47/002
(Continued)

(56) References Cited

U.S. PATENT DOCUMENTS 3,633,098 A    1/1972   Westlund
5,256,973 A *  10/1993  Thee et al. .................... 324/418
(Continued)

FOREIGN PATENT DOCUMENTS

DE          203 10 043 U1   12/2004
DE     10 2004 054 374 B3    5/2006
(Continued)

OTHER PUBLICATIONS

Machine translation of JP 2006/136161 A obtained from JPO online translator.*
(Continued)

*Primary Examiner* — Jermele M Hollington
*Assistant Examiner* — Demetrius Pretlow
(74) *Attorney, Agent, or Firm* — Maginot, Moore & Beck LLP

(57) ABSTRACT

A method for predicting the usability of a relay or a contactor is described herein. A current flowing through the relay or the contactor and/or a voltage applied to the relay or the contactor is measured repeatedly, and the measured values are transmitted to an observation unit. The observation unit makes a prediction relating to the usability of the relay or of the contactor on the basis of the measured values and a model. Furthermore described are an observation unit and a battery which are configured to carry out the method according to the disclosure.

9 Claims, 2 Drawing Sheets

(51) Int. Cl.
*H01H 47/00* (2006.01)
*B60L 3/00* (2006.01)
*B60L 3/04* (2006.01)
*H01H 47/02* (2006.01)
*H01H 71/04* (2006.01)

(52) U.S. Cl.
CPC ........ *H01H 47/002* (2013.01); *B60L 2240/36* (2013.01); *B60L 2240/545* (2013.01); *B60L 2240/547* (2013.01); *B60L 2240/662* (2013.01); *B60L 2250/10* (2013.01); *B60L 2260/50* (2013.01); *B60L 2270/20* (2013.01); *H01H 2047/009* (2013.01); *H01H 2047/025* (2013.01); *H01H 2071/044* (2013.01); *Y02T 10/7291* (2013.01); *Y02T 90/16* (2013.01)

(58) Field of Classification Search
USPC .................................................. 324/418–419
See application file for complete search history.

(56) References Cited

U.S. PATENT DOCUMENTS

| | | | | |
|---|---|---|---|---|
| 5,420,571 A | * | 5/1995 | Coleman et al. | 340/644 |
| 5,559,438 A | * | 9/1996 | Bedouet et al. | 324/418 |
| 5,754,387 A | * | 5/1998 | Tennies et al. | 361/170 |
| 5,801,461 A | * | 9/1998 | Anger et al. | 307/139 |
| 5,969,436 A | * | 10/1999 | Chalasani | H02J 9/06 |
| | | | | 307/64 |
| 6,089,310 A | | 7/2000 | Toth et al. | |
| 6,313,636 B1 | * | 11/2001 | Pohl | H01H 1/0015 |
| | | | | 324/421 |
| 8,513,953 B2 | * | 8/2013 | Myoen et al. | 324/538 |
| 2003/0080746 A1 | * | 5/2003 | Imai et al. | 324/418 |
| 2003/0132752 A1 | * | 7/2003 | Johnson et al. | 324/418 |
| 2004/0085071 A1 | * | 5/2004 | Sankey | 324/418 |
| 2005/0275993 A1 | * | 12/2005 | Phillips | 361/103 |
| 2006/0212745 A1 | * | 9/2006 | Zansky et al. | 714/6 |
| 2007/0115604 A1 | * | 5/2007 | Zettel et al. | 361/160 |
| 2007/0195853 A1 | * | 8/2007 | Park et al. | 374/1 |
| 2008/0074215 A1 | * | 3/2008 | Zhou | H01H 1/0015 |
| | | | | 335/132 |
| 2009/0212975 A1 | | 8/2009 | Ausman et al. | |

FOREIGN PATENT DOCUMENTS

| | | |
|---|---|---|
| DE | 10 2005 046 925 A1 | 4/2007 |
| EP | 1 335 484 A2 | 8/2003 |
| EP | 2 166 365 A1 | 3/2010 |
| JP | 5-11277 U | 2/1993 |
| JP | 09093983 A * | 4/1997 |
| JP | 2000-134707 A | 5/2000 |
| JP | 2004-198503 A | 7/2004 |
| JP | 2006136161 A * | 5/2006 |

OTHER PUBLICATIONS

International Search Report corresponding to PCT Application No. PCT/EP2011/065097, mailed Dec. 28, 2011 (German and English language document) (7 pages).

* cited by examiner

METHOD FOR PREDICTING THE USABILITY OF A RELAY OR A CONTACTOR

This application is a 35 U.S.C. §371 National Stage Application of PCT/EP2011/065097, filed on Sep. 1, 2011, which claims the benefit of priority to Serial No. DE 10 2010 041 998.2, filed on Oct. 5, 2010 in Germany, the disclosures of which are incorporated herein by reference in their entirety.

The present disclosure relates to a method for predicting the usability of a relay or a contactor and to a monitoring unit which is configured to implement the method according to the disclosure.

BACKGROUND

It will be the case in the future that new battery systems will increasingly be used both in stationary applications (for example in wind power installations) and in vehicles (for example in hybrid and electric vehicles), with very stringent requirements in terms of reliability being placed on these new battery systems. The background for these stringent requirements are that failure of the battery can result in failure of the entire system (for example failure of the traction battery in an electric vehicle) or even in safety-relevant problems (in wind power installations batteries are used, for example, for protecting the installation from impermissible operating states as a result of rotor blade adjustment in the case of a strong wind).

In order to enable isolation of the battery system from the connected consumers, for example from an on-board vehicle power supply system, relays (or contactors) are generally provided in series with the two battery terminals. These relays must make it possible for such a system to be disconnected a plurality of times on load. In order to meet these stringent requirements, it needs to be possible to both diagnose and predict the functionality of these relays.

In relays and contactors, a switchable electromagnet acts as drive for the actuation of contacts for switching on, switching off and switching over an electrical load. In this case, the contacts are in principle subject to different levels of wear during switching of electrical loads, and this wear increases considerably in the case of loads with medium to high powers. In this case, it may also arise that the contacts are welded to one another and thereby jam, which can result in considerable hazard situations. It is therefore necessary to monitor the state of the switching contacts and to introduce corresponding additional disconnection measures for the electrical load.

DE 20310043 U1 describes a monitoring apparatus in which a check element for the coil of the relay is associated with the relay to be monitored. The checking device in this case provides information in respect of whether the coil has been actuated or not. This is made possible by virtue of the fact that the check element comprises a component part which is sensitive to magnetic fields and is arranged in the vicinity of the coil in such a way that, when the coil is switched on, the magnetic field produced by said coil flows through said check element, as a result of which the magnetic field of the coil activates the check element. In this case, a reed contact is provided as check element. One disadvantage with such an arrangement consists in that an additional component part necessarily needs to be provided on the relay to be monitored.

SUMMARY

The method according to the disclosure for predicting the usability of a relay or a contactor in principle comprises the following steps: a current flowing through the relay or the contactor is measured repeatedly, and the measured values are transmitted to a monitoring unit. The monitoring unit makes a prediction on the usability of the relay or the contactor on the basis of the measured values and a model.

Similarly, the method can also be implemented by virtue of the fact that a voltage present at the relay or the contactor is measured since this permits conclusions to be drawn on the current flowing through the relay or the contactor, and vice versa. In principle, this is possible when the (equivalent) resistance of the relay or the contactor in the various phases (during closing and during a closed state) is known. Therefore, either current measured values or voltage measured values can be evaluated by the monitoring unit, wherein the monitoring unit typically calculates the powers acting at the relay or at the contactor from this. It is also possible for measured values of the two physical variables to be evaluated simultaneously by the monitoring unit, which can be advantageous owing to the redundancy associated therewith.

The model used by the monitoring unit can be based on characteristics which draw a relationship between, for example, the electrical powers which are switched or the arcs which are produced by the potential differences present and changes at the relay or at the contactor.

The method according to the disclosure can be used in particular for calculating aging or for predicting jamming of the relay or the contactor.

It is preferred for the monitoring unit to estimate a present temperature of the relay or the contactor on the basis of the measured values and the model. Owing to the fact that the present temperature of the relay or the contactor is calculated in the monitoring unit, there is now no need to measure the temperature using a temperature detection apparatus arranged on the relay or the contactor. Instead, the disclosure manages in principle without the use of temperature detection apparatuses. However, the estimation of the present temperature of the relay or the contactor can be improved by virtue of the fact that an ambient temperature of the relay or the contactor is measured and the ambient temperature measured value is transmitted to the monitoring unit. However, it is sufficient here to provide a temperature detection apparatus which is arranged outside the relay or the contactor and not anywhere near said relay or contactor. For example, when using the method in a battery, the battery temperature which is detected in any case by a battery management unit can be transmitted to the monitoring unit.

The current flowing through the relay or the contactor or the voltage present at the relay or the contactor can be measured in different phases: during a switching operation of the relay or the contactor in which the relay or the contactor changes from an open state to a closed state (or vice versa) or else during the closed state. When the estimated temperature of the relay or the contactor exceeds a temperature threshold value, a warning signal can be generated. As a result of this or as a result of similar measures, jamming of the relay or the contactor can be avoided, which represents an advantage in terms of safety and reliability.

A further aspect of the disclosure relates to a monitoring unit which is configured to implement the method according to the disclosure, to a battery, preferably a lithium-ion battery, with the monitoring unit according to the disclosure and to a motor vehicle with the battery according to the disclosure.

In addition to its use in a battery system of a motor vehicle, the disclosure can also advantageously be used in other systems, for example motor stop-start systems, in order to predict the life of relays or contactors. In motor stop-start systems, a relay for activating the starter is provided, which relay is connected upstream of a starter motor. In this case, too, high currents flow during a switch-on operation, and these high currents may damage the contacts of the relay.

BRIEF DESCRIPTION OF THE DRAWINGS

Exemplary embodiments of the disclosure will be explained in more detail with reference to the drawings and the description below. In the drawings.

DETAILED DESCRIPTION

Figure 1:
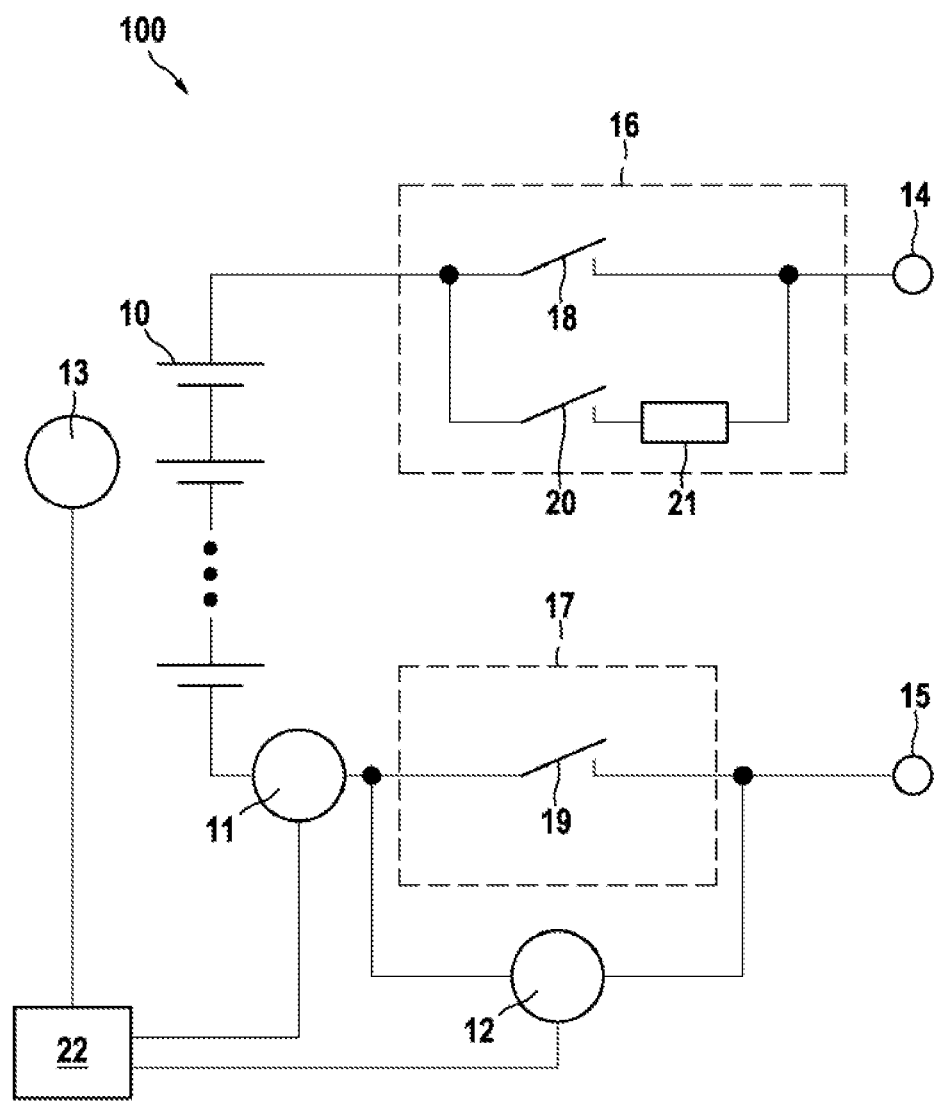
FIG. 1 shows an exemplary embodiment of the battery according to the disclosure.

FIG. 1 shows a battery denoted overall by 100 in a block circuit diagram. A multiplicity of battery cells 10 are connected in series and optionally additionally in parallel in order to achieve a high output voltage and battery capacity desired for a respective application. A charging and isolating device 16 is connected between the positive pole of the battery cells and a positive battery terminal 14. In addition, an isolating device 17 is connected between the negative pole of the battery cells 10 and a negative battery terminal 15. The isolating and charging device and the isolating device 17 each comprise a contactor 18 and 19, respectively, which are provided for disconnecting the battery cells from the battery terminals 14, 15 in order to switch the battery terminals to zero potential. Owing to the high DC voltage of the series-connected battery cells 10, there is a considerable potential risk for maintenance personnel or the like otherwise. In addition, a charging contactor 20 with a charging resistor 21 connected in series with the charging contactor 20 is provided in the charging and isolating device 16. The charging resistor 21 limits a charging current when the battery is connected to a DC voltage intermediate circuit (not illustrated). For this purpose, first the contactor 18 is left open and only the charging contactor 20 is closed. When the voltage at the positive battery terminal 14 reaches the voltage of the battery cells 10, the contactor 19 can be closed and possibly the charging contactor 20 can be opened. The contactors 18, 19 and the charging contactor 20 do not considerably increase the costs for a battery 100 since stringent requirements are placed on the reliability of said contactors and on the currents to be conducted through said contactors.

Every switch-on and connection process at the contactors 18, 19, 20 can age said contactors. It is therefore necessary to estimate the life of said contactors in order to be able to prevent failures and to provide a diagnosis as to when one of the contactors 18, 19, 20 needs to be replaced. The method according to the disclosure is designed with this in mind, with it being possible for said method to be applied to any of the contactors 18, 19, 20, but in this case this is only explained in respect of the (negative) contactor 19.

The battery 100 or a battery management unit (not illustrated in any more detail) comprises a current measurement unit 11, which is configured to measure a battery current and therefore also a current flowing through the contactor 19, a voltage apparatus 12, which is configured to measure a voltage present at the contactor 19, and a temperature measurement apparatus 13, which is configured to measure a battery temperature. In order to implement the method according to the disclosure, measurements either by the current measurement apparatus 11 or by the voltage apparatus 12 are sufficient, with the result that the respective other measurement apparatus and the temperature measurement device 13 merely provide redundant information, or information which fine-tunes the calculations.

The current measurement apparatus 11, the voltage apparatus 12 and the temperature measurement apparatus 13 transmit their measured values to a control device 22, which acts as monitoring unit, which implements the method according to the disclosure, or which comprises such a monitoring unit.

Therefore, the monitoring unit is provided in FIG. 1 as part of the battery 100, in particular a battery management unit. However, the monitoring unit can also be arranged outside the battery 100 and can be included in a main control device of a motor vehicle, for example.

It is not necessary to arrange the temperature measurement apparatus 13 in the vicinity of the contactor 19 to be monitored. The temperature measurement apparatus 13 does not directly measure the temperature of the contactor 19, but merely an ambient temperature, for example a temperature in the vicinity of the battery cells.

Figure 2:
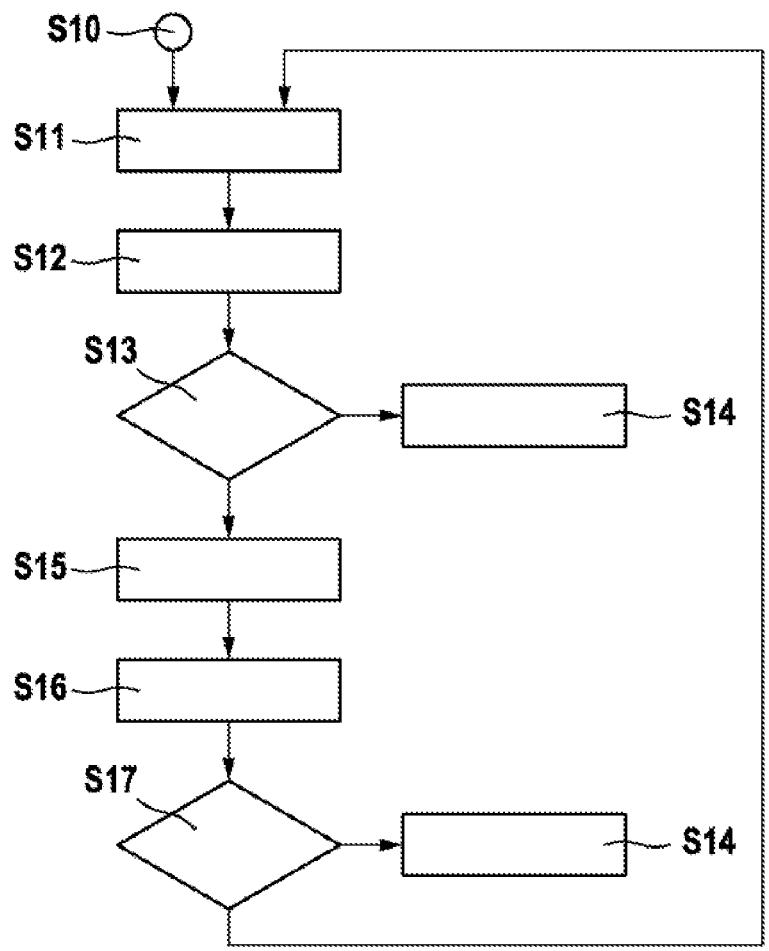
FIG. 2 shows an exemplary embodiment of the method according to the disclosure.

FIG. 2 shows an exemplary embodiment of the method according to the disclosure for predicting the usability of a contactor, which method is implemented in the battery 100 illustrated in FIG. 1. During the entire process, the current measurement apparatus 11, the voltage apparatus 12 and the temperature measurement apparatus 13 detect measurement data and transmit these to the monitoring unit 22. Likewise during the entire process, a present temperature of the contactor 19 is calculated or estimated by the monitoring unit 22. For the case in which no current is flowing through the contactor 19 for a relatively long period of time, the estimated temperature of the contactor 19 is equated with the ambient temperature.

In method step S11, the contactor 19 is in an open state. No current is flowing through the contactor 19, with the result that no further heating of the contactor 19 can take place.

In method step S12, the contactor 19 is closed. During the switching operation, a sparkover takes place, which heats the contacts of the contactor 19. The current pulse during the sparkover is measured and the temperature rise associated therewith in the contactor 19 is calculated by the monitoring unit 22.

Primarily on repeated opening and closing of the contactor 19 within a short period of time, the temperature of said contactor can increase such that the contacts jam owing to a welding process. Therefore, in step S13, the estimated temperature of the contactor is compared with a predetermined temperature threshold value. If the estimated temperature of the contactor 19 is greater than the predetermined temperature threshold value, a warning signal is generated in step S14 by virtue of, for example, a replacement recommendation being expressed, which can result in the avoidance of malfunction of the contactor 19. The estimation of the increase in temperature of the contactor 19 is in this case implemented on the basis of a temperature model which draws a relationship between a current pulse and the temperature rise associated therewith.

When the estimated temperature of the contactor 19 is no greater than the predetermined temperature threshold value, the profile of the current flowing through the contactor 19 during continuous operation, when the contacts are closed, is recorded in method step S15. In the process, the contactor 19 is heated by the continuing operating current. This heating of the contactor 19 is predicted by the model used by the monitoring unit 22. In this case, consideration is also given to the fact that the heating of the contacts is greater the greater the amount of damage already existing on the contacts. The aging of the contactor 19 can be predicted from the heating of the contacts, more precisely from the development of the estimated temperature of the contactor 19 over time.

In method step S16, the contactor 19 is opened again, which in turns results in a sparkover, as in method step S12. Again for the case (S17) in which the temperature rise which is caused by the arc produced is too high, a warning signal can be generated (S14). Otherwise, the branch returns to the beginning of the method in step S11, with this step corresponding to a closed state of the contactor 19.

The model used by the monitoring unit 22 can be fine-tuned by look-up tables, which are provided by the manufacturer of the contactor and generally indicate how long the life (measured as the number of switching operations) of a relay or a contactor is depending on a constant load current. In contrast to these figures, however, the model used by the monitoring unit 22 is designed to be able to make an aging prediction even in the case of variable currents and therefore to be able to take into consideration, for example, the case in which a first switching operation is implemented at a specific load current and then a second is implemented at a load current which is ten times higher.

The predictions in respect of the aging and the jamming of the contactor 19 are communicated by the monitoring unit 22 via a data link, in particular via a bus system, to other control devices, for example the main control device of the motor vehicle.

What is claimed is:

1. A method for predicting a usability of at least one of a relay and a contactor, comprising:
   determining measured values by measuring repeatedly with a first sensor at least one of (i) a current flowing through the at least one of the relay and the contactor, and (ii) a voltage between a first terminal of the at least one of the relay and the contactor and a second terminal of the at least one of the relay and the contactor, the measured values being measured during a switching operation of the at least one of the relay and the contactor;
   receiving with a monitoring unit the measured values from the first sensor;
   estimating an increase in a temperature of the at least one of the relay and the contactor during the switching operation based on the measured values and a temperature model; and
   predicting with the monitoring unit a usability of the at least one of the relay and the contactor based on the estimated increase in the temperature.

2. The method as claimed in claim 1, the predicting further comprising at least one of:
   calculating with the monitoring unit an aging of the at least one of the relay and the contactor; and
   predicting with the monitoring unit a jamming of at least one of the relay and the contactor with reference to the aging of the at least one of the relay and the contactor.

3. The method as claimed in claim 1, the predicting further comprising:
   estimating with the monitoring unit a present temperature of the at least one of the relay and the contactor based on the measured values and the model.

4. The method as claimed in claim 3, further comprising:
   measuring with a second sensor an ambient temperature value of the at least one of the relay and the contactor; and
   receiving with the monitoring unit the ambient temperature value from the second sensor.

5. The method as claimed in claim 1, the determining further comprising:
   determining the measured values by measuring the at least one of (i) the current flowing through the at least one of the relay and the contactor and (ii) the voltage between the first terminal of the at least one of the relay and the contactor and the second terminal of the at least one of the relay and the contactor while the at least one of the relay and the contactor is closed.

6. The method as claimed in claim 1, further comprising:
   generating a warning signal when an estimated temperature of the at least one of the relay and the contactor exceeds a temperature threshold value.

7. A monitoring unit operably connected to operate a sensor, the monitoring unit being configured to:
   determine measured values by measuring repeatedly with the sensor at least one of (i) a current flowing through the at least one of a relay and a contactor, and (ii) a voltage between a first terminal of the at least one of the relay and the contactor and a second terminal of the at least one of the relay and the contactor, the measured values being measured during a switching operation of the at least one of the relay and the contactor,
   receive the measured values from the sensor,
   estimate an increase in a temperature of the at least one of the relay and the contactor during the switching operation based on the measured values and a temperature model, and
   predict a usability of the at least one of the relay and the contactor based on the estimated increase in the temperature.

8. A battery comprising:
   at least one of a relay and a contactor; and
   a monitoring unit operably connected to operate a sensor, the monitoring unit being configured to:
      determine measured values by measuring repeatedly with the sensor at least one of (i) a current flowing through the at least one of the relay and the contactor, and (ii) a voltage between a first terminal of the at least one of the relay and the contactor and a second terminal of the at least one of the relay and the contactor, the measured values being measured during a switching operation of the at least one of the relay and the contactor,
      receive the measured values from the sensor,
      estimate an increase in a temperature of the at least one of the relay and the contactor during the switching operation based on the measured values and a temperature model, and
      predict a usability of the at least one of the relay and the contactor based on the estimated increase in the temperature.

9. The battery as claimed in claim 8, wherein the battery is included in an electric motor vehicle.

* * * * *